(12) United States Patent  
Tsai et al.

(10) Patent No.: US 9,209,280 B2  
(45) Date of Patent: *Dec. 8, 2015

(54) METHODS FOR DOPING FIN FIELD-EFFECT TRANSISTORS

(71) Applicant: TAIWAN SEMICONDUCTOR MANUFACTURING COMPANY, LTD., Hsinchu (TW)

(72) Inventors: Chun Hsiung Tsai, Xinpu Township (TW); Yu-Lien Huang, Jhubei (TW); De-Wei Yu, Ping-Tung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/621,035

(22) Filed: Feb. 12, 2015

(65) Prior Publication Data

US 2015/0155370 A1      Jun. 4, 2015

Related U.S. Application Data

(63) Continuation of application No. 12/768,884, filed on Apr. 28, 2010, now Pat. No. 8,980,719.

(51) Int. Cl.
*H01L 21/22* (2006.01)
*H01L 29/66* (2006.01)
(Continued)

(52) U.S. Cl.
CPC ...... *H01L 29/66803* (2013.01); *H01L 21/2254* (2013.01); *H01L 21/2255* (2013.01); *H01L 21/324* (2013.01); *H01L 29/167* (2013.01)

(58) Field of Classification Search
CPC ............ H01L 29/0615; H01L 29/0847; H01L 29/6659; H01L 29/66598; H01L 29/7833; H01L 29/78618; H01L 29/78627; H01L 29/78696; H01L 21/046; H01L 21/225; H01L 21/38; H01L 29/167; H01L 21/324; H01L 21/2255; H01L 21/823431; H01L 29/66803
USPC .......................................................... 438/558
See application file for complete search history.

(56) References Cited

U.S. PATENT DOCUMENTS 4,830,983 A    5/1989  Thornton
5,407,847 A    4/1995  Hayden et al.
(Continued)

FOREIGN PATENT DOCUMENTS

CN         1945829      4/2004
CN         101179046    5/2005
(Continued)

OTHER PUBLICATIONS

Office Action dated May 2, 2012 from corresponding application No. CN 201010196345.0.
(Continued)

*Primary Examiner* — Savitr Mulpuri
(74) *Attorney, Agent, or Firm* — Hauptman Ham, LLP

(57) ABSTRACT

A method of doping a FinFET includes forming a semiconductor fin on a substrate, the substrate having a first device region and a second device region. The semiconductor fin is formed on a surface of the substrate in the second device region and has a top surface and sidewalls. The first device region is covered with a hard mask and the semiconductor fin and the hard mask are exposed to a deposition process to form a dopant-rich layer having an n-type or p-type dopant on the top surface and the sidewalls of the semiconductor fin. The dopant from the dopant-rich layer is diffused into the semiconductor fin by performing an annealing process in which the first device region is free of diffusion of the diffused dopant or another dopant from the hard mask.

20 Claims, 6 Drawing Sheets

(51) Int. Cl.
  *H01L 21/225* (2006.01)
  *H01L 21/324* (2006.01)
  *H01L 29/167* (2006.01)

(56) References Cited

U.S. PATENT DOCUMENTS

| | | | |
|---|---|---|---|
| 5,581,202 A | 12/1996 | Yano et al. | |
| 5,658,417 A | 8/1997 | Watanabe et al. | |
| 5,767,732 A | 6/1998 | Lee et al. | |
| 5,949,986 A | 9/1999 | Riley et al. | |
| 5,963,789 A | 10/1999 | Tsuchiaki | |
| 6,065,481 A | 5/2000 | Fayfield et al. | |
| 6,121,786 A | 9/2000 | Yamagami et al. | |
| 6,299,724 B1 | 10/2001 | Fayfield et al. | |
| 6,503,794 B1 | 1/2003 | Watanabe et al. | |
| 6,613,634 B2 | 9/2003 | Ootsuka et al. | |
| 6,622,738 B2 | 9/2003 | Scovell | |
| 6,642,090 B1 | 11/2003 | Fried et al. | |
| 6,706,571 B1 | 3/2004 | Yu et al. | |
| 6,713,365 B2 | 3/2004 | Lin et al. | |
| 6,727,557 B2 | 4/2004 | Takao | |
| 6,740,247 B1 | 5/2004 | Han et al. | |
| 6,743,673 B2 | 6/2004 | Watanabe et al. | |
| 6,762,448 B1 | 7/2004 | Lin et al. | |
| 6,791,155 B1 | 9/2004 | Lo et al. | |
| 6,828,646 B2 | 12/2004 | Marty et al. | |
| 6,830,994 B2 | 12/2004 | Mitsuki et al. | |
| 6,858,478 B2 | 2/2005 | Chau et al. | |
| 6,872,647 B1 | 3/2005 | Yu et al. | |
| 6,940,747 B1 | 9/2005 | Sharma et al. | |
| 6,949,768 B1 | 9/2005 | Anderson et al. | |
| 6,964,832 B2 | 11/2005 | Moniwa et al. | |
| 7,009,273 B2 | 3/2006 | Inoh et al. | |
| 7,018,901 B1 | 3/2006 | Thean et al. | |
| 7,026,232 B1 | 4/2006 | Koontz et al. | |
| 7,067,400 B2 | 6/2006 | Bedell et al. | |
| 7,078,312 B1 | 7/2006 | Sutanto et al. | |
| 7,084,079 B2 | 8/2006 | Conti et al. | |
| 7,084,506 B2 | 8/2006 | Takao | |
| 7,112,495 B2 | 9/2006 | Ko et al. | |
| 7,153,744 B2 | 12/2006 | Chen et al. | |
| 7,157,351 B2 | 1/2007 | Cheng et al. | |
| 7,190,050 B2 | 3/2007 | King et al. | |
| 7,193,399 B2 | 3/2007 | Aikawa | |
| 7,235,436 B1 | 6/2007 | Lin et al. | |
| 7,247,887 B2 | 7/2007 | King et al. | |
| 7,265,008 B2 | 9/2007 | King et al. | |
| 7,265,418 B2 | 9/2007 | Yun et al. | |
| 7,297,600 B2 | 11/2007 | Oh et al. | |
| 7,300,837 B2 | 11/2007 | Chen et al. | |
| 7,315,994 B2 | 1/2008 | Aller et al. | |
| 7,323,375 B2 | 1/2008 | Yoon et al. | |
| 7,338,614 B2 | 3/2008 | Martin et al. | |
| 7,351,622 B2 | 4/2008 | Buh et al. | |
| 7,358,166 B2 | 4/2008 | Agnello et al. | |
| 7,361,563 B2 | 4/2008 | Shin et al. | |
| 7,374,986 B2 | 5/2008 | Kim et al. | |
| 7,394,116 B2 | 7/2008 | Kim et al. | |
| 7,396,710 B2 | 7/2008 | Okuno | |
| 7,407,847 B2 | 8/2008 | Doyle et al. | |
| 7,410,844 B2 | 8/2008 | Li et al. | |
| 7,425,740 B2 | 9/2008 | Liu et al. | |
| 7,442,967 B2 | 10/2008 | Ko et al. | |
| 7,456,087 B2 | 11/2008 | Cheng | |
| 7,494,862 B2 | 2/2009 | Doyle et al. | |
| 7,508,031 B2 | 3/2009 | Liu et al. | |
| 7,528,465 B2 | 5/2009 | King et al. | |
| 7,534,689 B2 | 5/2009 | Pal et al. | |
| 7,538,387 B2 | 5/2009 | Tsai | |
| 7,538,391 B2 | 5/2009 | Chidambarrao et al. | |
| 7,550,332 B2 | 6/2009 | Yang | |
| 7,598,145 B2 | 10/2009 | Damlencourt et al. | |
| 7,605,449 B2 | 10/2009 | Liu et al. | |
| 7,682,911 B2 | 3/2010 | Jang et al. | |
| 7,759,228 B2 | 7/2010 | Sugiyama et al. | |
| 7,795,097 B2 | 9/2010 | Pas | |
| 7,798,332 B1 | 9/2010 | Brunet | |
| 7,820,513 B2 | 10/2010 | Hareland et al. | |
| 7,851,865 B2 | 12/2010 | Anderson et al. | |
| 7,868,317 B2 | 1/2011 | Yu et al. | |
| 7,898,041 B2 | 3/2011 | Radosavljevic et al. | |
| 7,923,321 B2 | 4/2011 | Lai et al. | |
| 7,923,339 B2 | 4/2011 | Meunier-Beillard et al. | |
| 7,960,791 B2 | 6/2011 | Anderson et al. | |
| 7,985,633 B2 | 7/2011 | Cai et al. | |
| 7,989,846 B2 | 8/2011 | Furuta | |
| 7,989,855 B2 | 8/2011 | Narihiro | |
| 8,003,466 B2 | 8/2011 | Shi et al. | |
| 8,043,920 B2 | 10/2011 | Chan et al. | |
| 8,076,189 B2 | 12/2011 | Grant | |
| 8,101,475 B2 | 1/2012 | Oh et al. | |
| 8,361,871 B2 * | 1/2013 | Pillarisetty et al. | 438/300 |
| 2002/0144230 A1 | 10/2002 | Rittman | |
| 2003/0080361 A1 | 5/2003 | Murthy et al. | |
| 2003/0109086 A1 | 6/2003 | Arao | |
| 2003/0145299 A1 | 7/2003 | Fried et al. | |
| 2003/0234422 A1 | 12/2003 | Wang et al. | |
| 2004/0048424 A1 | 3/2004 | Wu et al. | |
| 2004/0075121 A1 | 4/2004 | Yu et al. | |
| 2004/0129998 A1 | 7/2004 | Inoh et al. | |
| 2004/0192067 A1 | 9/2004 | Ghyselen et al. | |
| 2004/0219722 A1 | 11/2004 | Pham et al. | |
| 2004/0259315 A1 | 12/2004 | Sakaguchi et al. | |
| 2005/0020020 A1 | 1/2005 | Collaert et al. | |
| 2005/0051865 A1 | 3/2005 | Lee et al. | |
| 2005/0082616 A1 | 4/2005 | Chen et al. | |
| 2005/0153490 A1 | 7/2005 | Yoon et al. | |
| 2005/0170593 A1 | 8/2005 | Kang et al. | |
| 2005/0212080 A1 | 9/2005 | Wu et al. | |
| 2005/0221591 A1 | 10/2005 | Bedell et al. | |
| 2005/0224800 A1 | 10/2005 | Lindert et al. | |
| 2005/0233598 A1 | 10/2005 | Jung et al. | |
| 2005/0266698 A1 | 12/2005 | Cooney et al. | |
| 2005/0280102 A1 | 12/2005 | Oh et al. | |
| 2006/0038230 A1 | 2/2006 | Ueno et al. | |
| 2006/0068553 A1 | 3/2006 | Thean et al. | |
| 2006/0091481 A1 | 5/2006 | Li et al. | |
| 2006/0091482 A1 | 5/2006 | Kim et al. | |
| 2006/0091937 A1 | 5/2006 | Do | |
| 2006/0105557 A1 | 5/2006 | Klee et al. | |
| 2006/0128071 A1 | 6/2006 | Rankin et al. | |
| 2006/0138572 A1 | 6/2006 | Arikado et al. | |
| 2006/0151808 A1 | 7/2006 | Chen et al. | |
| 2006/0153995 A1 | 7/2006 | Narwankar et al. | |
| 2006/0166475 A1 | 7/2006 | Manti | |
| 2006/0214212 A1 | 9/2006 | Horita et al. | |
| 2006/0258156 A1 | 11/2006 | Kitti | |
| 2007/0001173 A1 | 1/2007 | Brask et al. | |
| 2007/0004218 A1 | 1/2007 | Lee et al. | |
| 2007/0015334 A1 | 1/2007 | Kitti et al. | |
| 2007/0020827 A1 | 1/2007 | Buh et al. | |
| 2007/0024349 A1 | 2/2007 | Tsukude | |
| 2007/0026615 A1 | 2/2007 | Goktepeli et al. | |
| 2007/0029576 A1 | 2/2007 | Nowak et al. | |
| 2007/0048907 A1 | 3/2007 | Lee et al. | |
| 2007/0063276 A1 | 3/2007 | Beintner | |
| 2007/0076477 A1 | 4/2007 | Hwang et al. | |
| 2007/0084564 A1 | 4/2007 | Gupta et al. | |
| 2007/0093010 A1 | 4/2007 | Mathew et al. | |
| 2007/0093036 A1 | 4/2007 | Cheng et al. | |
| 2007/0096148 A1 | 5/2007 | Hoentschel et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145487 A1 | 6/2007 | Kavalieros et al. | |
| 2007/0152276 A1 | 7/2007 | Arnold et al. | |
| 2007/0166929 A1 | 7/2007 | Matsumoto et al. | |
| 2007/0178637 A1 | 8/2007 | Jung et al. | |
| 2007/0221956 A1 | 9/2007 | Inaba | |
| 2007/0236278 A1 | 10/2007 | Hur et al. | |
| 2007/0241414 A1 | 10/2007 | Narihiro | |
| 2007/0247906 A1 | 10/2007 | Watanabe et al. | |

(56) References Cited

U.S. PATENT DOCUMENTS

| | | | |
|---|---|---|---|
| 2007/0254440 | A1 | 11/2007 | Daval |
| 2008/0001171 | A1 | 1/2008 | Tezuka et al. |
| 2008/0036001 | A1 | 2/2008 | Yun et al. |
| 2008/0042209 | A1 | 2/2008 | Tan et al. |
| 2008/0050882 | A1 | 2/2008 | Bevan et al. |
| 2008/0085580 | A1 | 4/2008 | Doyle et al. |
| 2008/0085590 | A1 | 4/2008 | Yao et al. |
| 2008/0095954 | A1 | 4/2008 | Gabelnick et al. |
| 2008/0102586 | A1 | 5/2008 | Park |
| 2008/0124878 | A1 | 5/2008 | Cook et al. |
| 2008/0227241 | A1 | 9/2008 | Nakabayashi et al. |
| 2008/0265344 | A1 | 10/2008 | Mehrad et al. |
| 2008/0290470 | A1 | 11/2008 | King et al. |
| 2008/0296632 | A1 | 12/2008 | Moroz et al. |
| 2008/0318392 | A1 | 12/2008 | Hung et al. |
| 2009/0026540 | A1 | 1/2009 | Sasaki et al. |
| 2009/0039388 | A1 | 2/2009 | Teo et al. |
| 2009/0066763 | A1 | 3/2009 | Fujii et al. |
| 2009/0155969 | A1 | 6/2009 | Chakravarti et al. |
| 2009/0166625 | A1 | 7/2009 | Ting et al. |
| 2009/0181477 | A1 | 7/2009 | King et al. |
| 2009/0200612 | A1 | 8/2009 | Koldiaev |
| 2009/0239347 | A1 | 9/2009 | Ting et al. |
| 2009/0309162 | A1 | 12/2009 | Baumgartner et al. |
| 2009/0321836 | A1 | 12/2009 | Wei et al. |
| 2010/0155790 | A1 | 6/2010 | Lin et al. |
| 2010/0163926 | A1 | 7/2010 | Hudait et al. |
| 2010/0183961 | A1 | 7/2010 | Shieh et al. |
| 2010/0187613 | A1 | 7/2010 | Colombo et al. |
| 2010/0207211 | A1 | 8/2010 | Sasaki et al. |
| 2010/0308379 | A1 | 12/2010 | Kuan et al. |
| 2011/0018065 | A1 | 1/2011 | Curatola et al. |
| 2011/0108920 | A1 | 5/2011 | Basker et al. |
| 2011/0129990 | A1 | 6/2011 | Mandrekar et al. |
| 2011/0195555 | A1 | 8/2011 | Tsai et al. |
| 2011/0195570 | A1 | 8/2011 | Lin et al. |
| 2011/0256682 | A1 | 10/2011 | Yu et al. |
| 2012/0086053 | A1 | 4/2012 | Tseng et al. |

FOREIGN PATENT DOCUMENTS

| | | |
|---|---|---|
| CN | 101359622 | 2/2009 |
| CN | 101459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Office Action dated May 4, 2012 from corresponding application No. CN 201010243667.6.

Office Action dated Jun. 20, 2012 from corresponding application No. CN 201010263807.6.

Office Action dated Apr. 8, 2013 from corresponding application No. CN201010263807.6.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "Speedie: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liaw, Tsung-Yang et al., "Strained N-Channel FinFETs Featuring in Situ Doped Silicon-Carbon Si1-YCy Source Drain Stressors with High Carbon Content", IEEE Transactions on Electron Devices 55_9 {(2008): 2475-483.

Office Action dated Mar. 28, 2012 from corresponding application No. CN 201010228334.6.

Notice of Decision on Patent dated Mar. 12, 2012 and English translation from corresponding application No. KR10-2010-0072103.

OA dated Mar. 27, 2012 from corresponding application No. KR10-2010-0094454.

OA dated Mar. 29, 2012 from corresponding application No. KR10-2010-0090264.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Tezuka, T., et al., "Dislocation-Free Formation of Relaxed SiGe-on-Insulators Layers", Applied Physics Letters, vol. 80, No. 19, May 13, 2002, pp. 3560-3562.

* cited by examiner ically used to form a lightly doped drain (LDD) region. Ion implantation creates a non-conformal doping profile of the fin (for example, heavier doping at the top of the fin than the bottom of the fin, which is found closer to the substrate). This non-conformal doping profile may create issues including those associated non-uniform device turn on. By using a tilt implant, the photo resist height induced shadowing effects and pre amorphization (PAI) induced twin boundary defects will be disadvantageous.

METHODS FOR DOPING FIN FIELD-EFFECT TRANSISTORS

PRIORITY CLAIM

The present application is a continuation of U.S. application Ser. No. 12/768,884, filed Apr. 28, 2010, which is incorporated herein by reference in its entirety.

RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The disclosure relates generally to integrated circuit devices, and more particularly to methods for doping fin field-effect transistors (FinFETs).

BACKGROUND

In the rapidly advancing semiconductor manufacturing industry, complementary metal oxide semiconductor (CMOS) FinFET devices may be used in many logic and other applications and are integrated into various different types of semiconductor devices. FinFET devices typically include semiconductor fins with high aspect ratios in which the channel and source/drain regions for the transistor are formed. A gate is formed over and along the sides of the portion of the fin devices utilizing the advantage of the increased surface area of the channel and source/drain regions to produce faster, more reliable and better-controlled semiconductor transistor devices. Further advantages of FinFETs include reducing the short channel effect and higher current flow.

Current FinFET technology has challenges however. For example, ion implantation is typAs such, an improved fabrication method for a FinFET element is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

Figure 11:
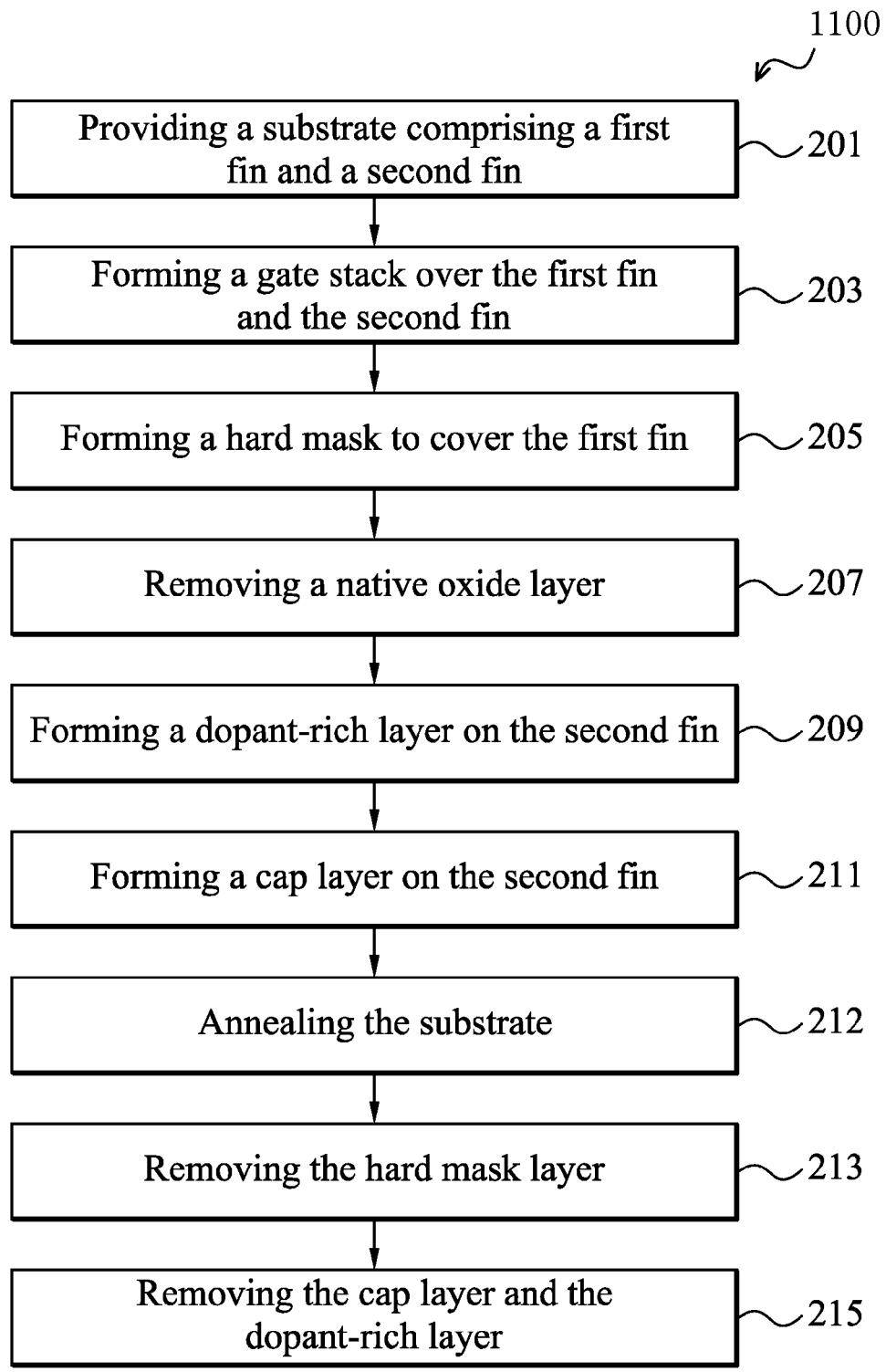
FIG. 11 depicts a flowchart of a method for fabricating FinFET structures according to one embodiment.

FIGS. 1 to 8 are perspective and cross-sectional views of FinFET structure at various stages of manufacture. FIG. 11 depicts a flowchart of a method 1100 for fabricating FinFET structures according to one embodiment of the invention.

Figure 1:
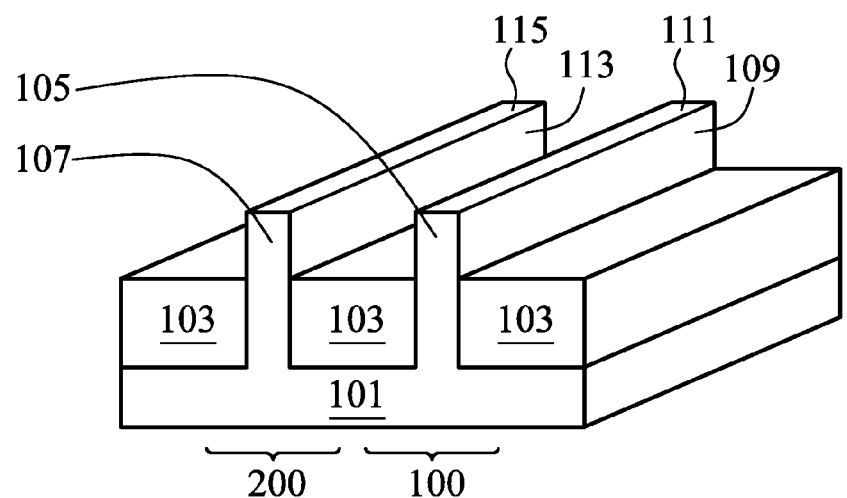
FIGS. 1 to 8 show various stages during fabrication of a FinFET structure on a substrate according to one or more embodiments.

Referring to FIG. 1 and FIG. 11, in process step 201, a substrate comprising a first fin 105 and a second fin 107 is provided. In some embodiments, substrate 101 may be a silicon substrate, a germanium substrate, or a substrate formed of other semiconductor materials. Substrate 101 may be doped with a p-type or an n-type dopant. Isolation regions such as shallow trench isolation (STI) regions 103 may be formed in or over substrate 101. The first semiconductor fin 105 and the second semiconductor fin 107 extend above the top surfaces of STI regions 103. The first semiconductor fin 105 has a top surface 111 and sidewalls 109. The second semiconductor fin 107 has a top surface 115 and sidewalls 113. Substrate 101 includes a portion in first device region 100 and a portion in second device region 200. Semiconductor fins 105 and 107 are in first device region 100 and second device region 200, respectively. In an embodiment, first device region 100 and second device region 200 are used to form one n-type FinFET and one p-type FinFET.

Figure 2:
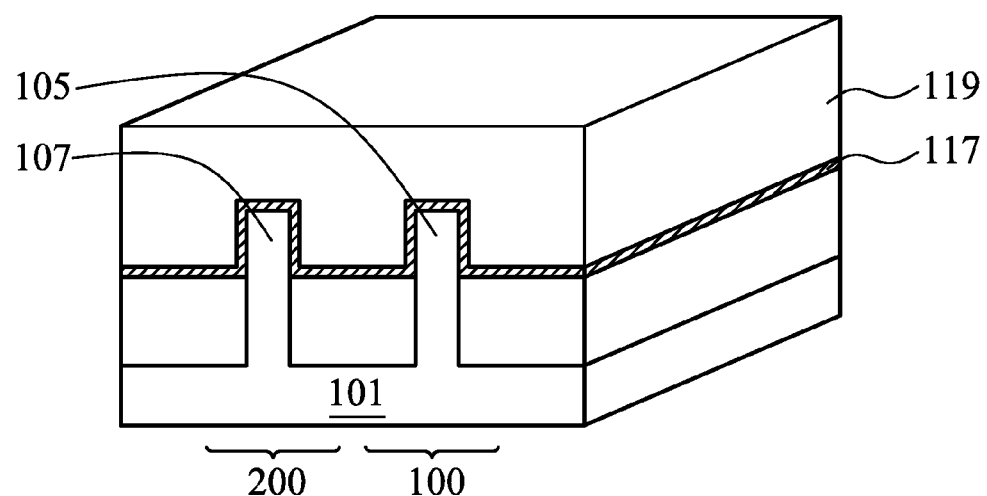

Referring to FIG. 2, gate dielectric layer 117 and gate electrode layer 119 are deposited in both first device region 100 and second device region 200 and over semiconductor fins 105 and 107. In an embodiment, gate dielectric layer 117 is formed of a high dielectric constant (high-k) dielectric material. The exemplary high-k materials may have k values greater than about 4.0, or even greater than about 7.0, and may include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. Gate electrode layer 119 is formed on gate dielectric layer 117, and may be formed of a conductive material such as doped polysilicon, metals, or metal nitrides.

Figure 3:
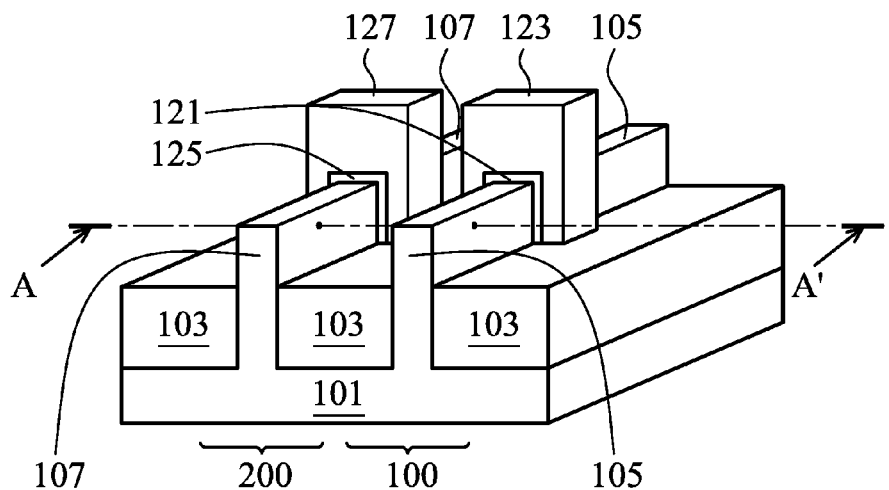

Referring to FIG. 3 and FIG. 11, in process step 203, gate electrode layer 119 and gate dielectric layer 117 are then patterned to form gate stacks. The gate stack in first device region 100 includes gate electrode 123 and gate dielectric 121. The gate stack in second device region 200 includes gate electrode 127 and gate dielectric 125. The gate stacks are over a portion of the top surfaces 111, 115 and the sidewalls 109, 113 of each of the semiconductor fins 105 and 107. In some embodiments, the exposed portions of semiconductor fins 105 and 107 may be left as they are, so that subsequent pocket and lightly doped source and drain (LDD) regions may be formed. In some alternative embodiments, the exposed portions of semiconductor fins 105 and 107 may be removed to form recesses, and semiconductor stressors may be epitaxially re-grown in the resulting recesses. In an exemplary embodiment, the semiconductor stressors in first device region 100 may comprise silicon carbon (SiC), while the semiconductor stressors in second device region 200 may comprise silicon germanium (SiGe)

Figure 4:
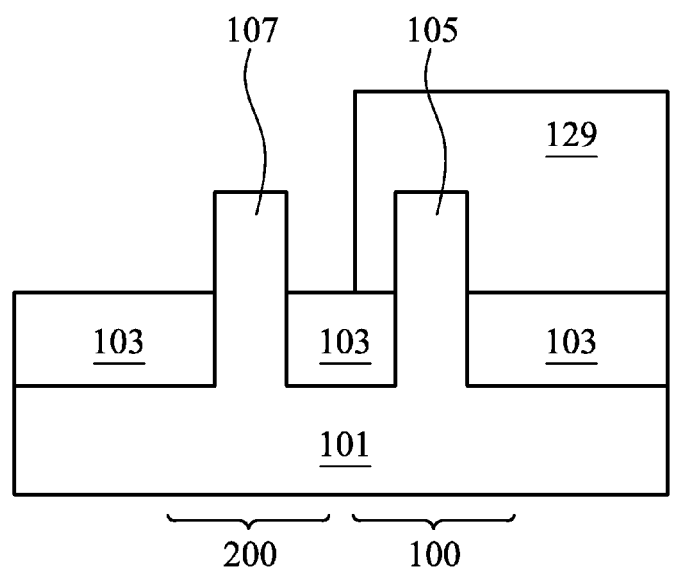

Referring to FIG. 4 and FIG. 11, in process step 205, hard mask 129 is formed and patterned to cover the first device region 100, while leaving the second device region 200 uncovered. FIG. 4 is a cross-sectional view obtained from the vertical plane crossing line A-A' in FIG. 3. Accordingly, the gate stacks are not shown.

Referring to FIG. 11, in process step 207, the process step 207 removes a native oxide layer on the exposed portion of the top surfaces 111, 115 and the sidewalls 109, 113 of each semiconductor fins 105 and 107. In one embodiment, the substrate 101 is dipped in a solution comprising a HF solution, which is diluted at a rate of 350:1. In another embodiment, the wet solution comprises any suitable solution being familiar to the skilled persons in the art. In some embodiments, the process step 207 comprises dry etching process being familiar to the skilled persons in the art.

Figure 5:
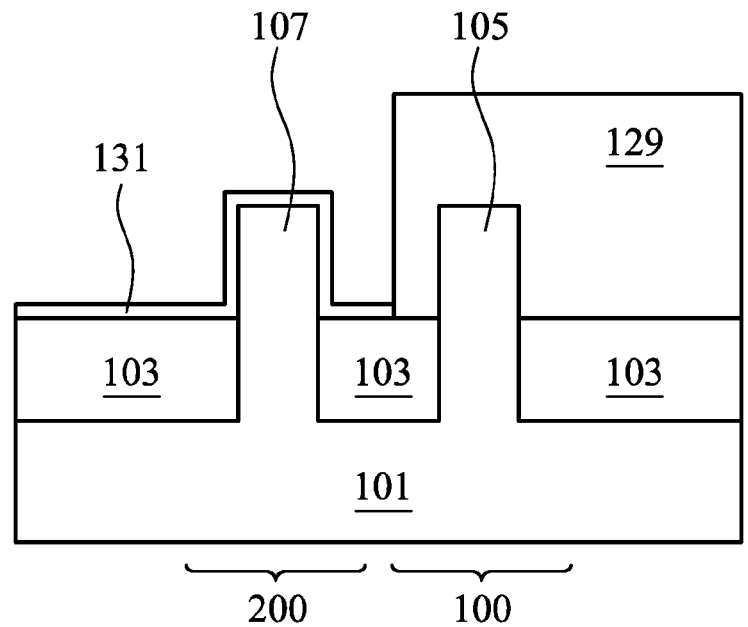
Figure 9:
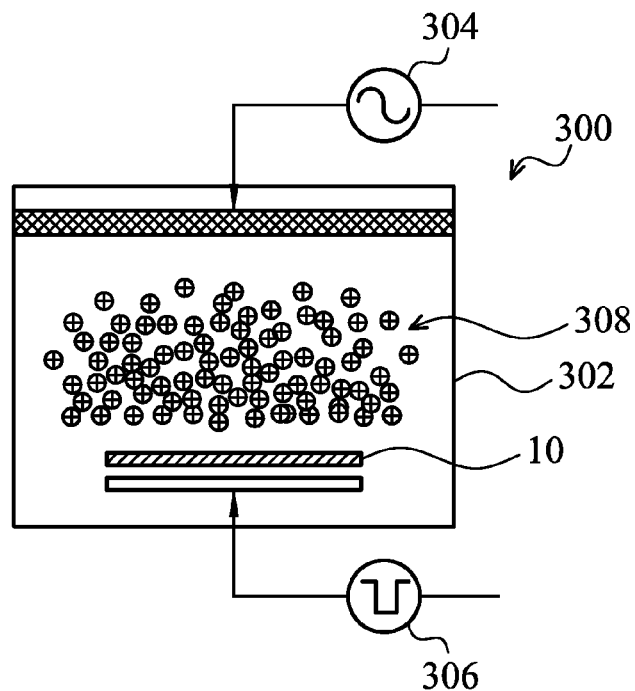
FIG. 9 illustrates an apparatus for performing method in accordance with an embodiment.

Referring to FIG. 5, wafer 10 is placed into apparatus 300 as shown in FIG. 9, which is used for performing a plasma assisted deposition process. Apparatus 300 includes chamber 302, in which wafer 10 is placed, and power sources 304 and 306 connected into chamber 302. Wafer 10 comprises the semiconductor fins 105 and 107 on the substrate 101. Power source 304 may be a radio frequency (RF) power source with programmable pulse modulation function, while power source 306 may be a pulsed DC or RF power source for providing a bias voltage on the wafer 10. Power sources 304 and 306 may be operated independently from each other. Each of the power sources 304 and 306 may be programmed to be independently powered on and off without affecting the other.

Referring to FIG. 5 and FIG. 11, in process step 209, dopant-rich layer 131 is deposited on the top surface 115 and the sidewalls 113 of the second semiconductor fin 107 using production tool 300 as illustrated in FIG. 9. The dopant-rich layer 131 comprises a dopant that is used for forming the desirable LDD regions in the second semiconductor fin 107. Depending on the desirable conductivity type of the resulting FinFET, dopant-rich layer 131 may be formed of an n-type dopant (impurities) or a p-type dopant (impurities). For example, if the resulting FinFET is a p-type FinFET, dopant-rich layer 131 may comprise boron and/or indium, while if the resulting FinFET is an n-type FinFET, dopant-rich layer 131 may comprise phosphorous and/or arsenic. In an exemplary embodiment, the atomic percentage of the desirable dopant in dopant-rich layer 131 may be greater than about 90 percent, and may actually be a pure dopant layer.

The process gases in chamber 302 (refer to FIG. 9) may include $AsH_3$, $B_2H_6$, $PH_3$, $BF_3$, dilution gas such as Xe, Ar, He, Ne, H2 and/or the like, depending on the desirable composition of dopant-rich layer 131. The process may be performed under a pressure less than about 100 mTorr. RF power source 304 (FIG. 9) is turned on to generate plasma 308. The power of RF power source 304 may be between about 50 watts and about 1,000 watts, for example, although a greater or a smaller power may also be used. In an embodiment, RF power source 304 is turned on continuously during the entire period for forming dopant-rich layer 131. In an alternative embodiment, RF power source 304 is pulsed (in an on and off pattern) in order to improve the conformity (the step coverage) of dopant-rich layer 131.

Figure 10:
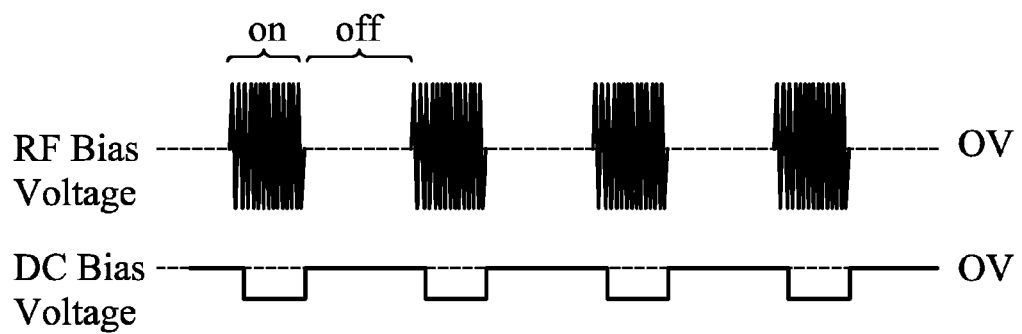
FIG. 10 shows schematic DC and RF bias voltages applied during the deposition of a dopant-rich layer.

During the formation of dopant-rich layer 131, DC power source 306 as in FIG. 9 has a low bias voltage lower than about 2 kV so that there is no unwanted amorphization layer formation during dopant layer formation. In an exemplary embodiment, the bias voltage output of DC power source 306 is between about 0 kV and about 2 kV. With the low or even zero DC bias voltage, the directionality of the ion doping process is reduced, and hence dopant-rich layer 131 may be deposited over the second semiconductor fin 107 as a separate layer, rather being directly implanted into fin 107. The DC bias voltage provided by DC power source 306 during the formation of dopant-rich layer 131 may also be pulsed (turned on and off) with a frequency of about 0.5 to about 10 KHz, as schematically illustrated in FIG. 10.

Figure 6:
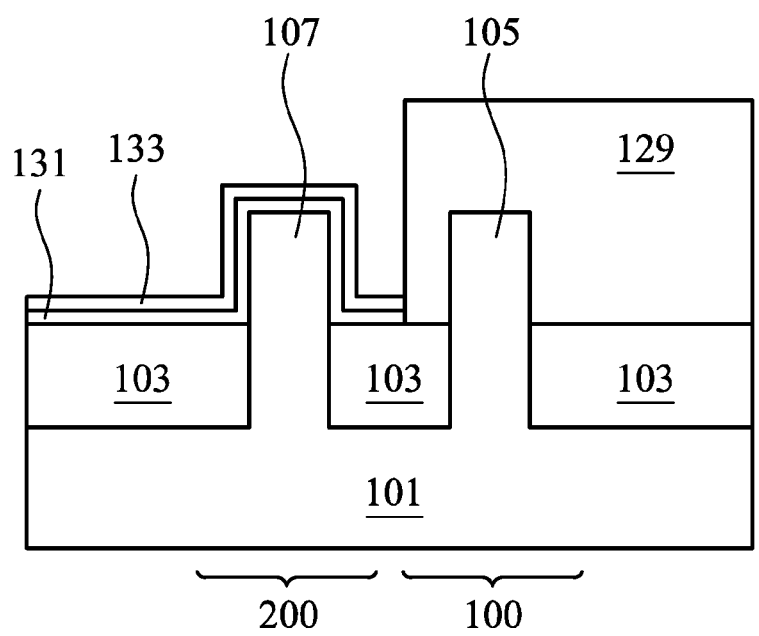

Referring to FIG. 6 and FIG. 11, in process step 211, a cap layer 133 is then deposited over the dopant-rich layer 131 on the second semiconductor fin 107. In some embodiments, the cap layer 133 may include silicon oxide, silicon nitride, silicon carbide or combinations thereof. The cap layer 133 has a thickness between about 30 Å to about 300 Å. Depending on cap layer 133 film density and compactness, the thickness of cap layer 133 should be controlled within a proper range. For example, in some embodiments, when the thickness is thinner than about 30 Å, the dopant in the dopant-rich layer 131 will diffuse out through the cap layer 133 during the following annealing process; when the thickness is thicker than about 300 Å, the cap layer 133 may peel off from the dopant-rich layer 131.

In one embodiment, the cap layer 133 is formed using plasma enhanced atomic layer deposition. Process precursor may include silanediamine, N, N, N', N'-tetraethyl (sold as SAM 24 by Air Liquide) and O2. An operation power of the deposition is about 20 W to about 500 W. The cap layer 133 is formed at a temperature below about 300° C. to prevent the dopant in the dopant-rich layer 131 from diffusing out through the cap layer 133 during the cap layer formation process. In some alternative embodiments, the cap layer 133 may be deposited using other deposition techniques capable of forming a conformal layer of $SiO_2$, $Si_3N_4$, or SiC.

Figure 7:
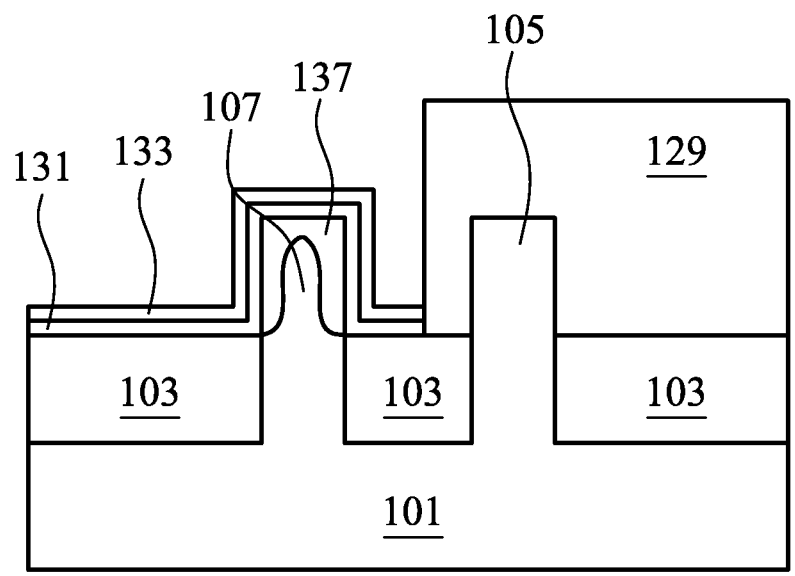

Referring to FIG. 7 and FIG. 11, in process step 212, the substrate 101 is annealed to form a LDD region 137 in the second semiconductor fin 107. The impurities in the dopant-rich layer 131 are activated and diffuse into the second semiconductor fin 107. The cap layer 133 prevents the dopant in the dopant-rich layer 131 from diffuse out through the cap layer 133 during the annealing process. The annealing may be performed at a wafer temperature between about 900° C. and about 1100° C. The annealing may be a millisecond annealing (MSA) or a rapid thermal annealing (RTA).

Next, in FIG. 11 of process step 213, the hard mask layer 129 in the first device region 100 is removed. Referring to FIG. 11, in process step 215, the cap layer 133 and the dopant-rich layer 131 are removed. In one embodiment, the process step 215 comprises dipping the substrate 101 in a wet solution comprising HF. In some embodiments, the process step 215 comprises etching the cap layer 133 and the dopant-rich layer 131 by a dry etching process.

Figure 8:
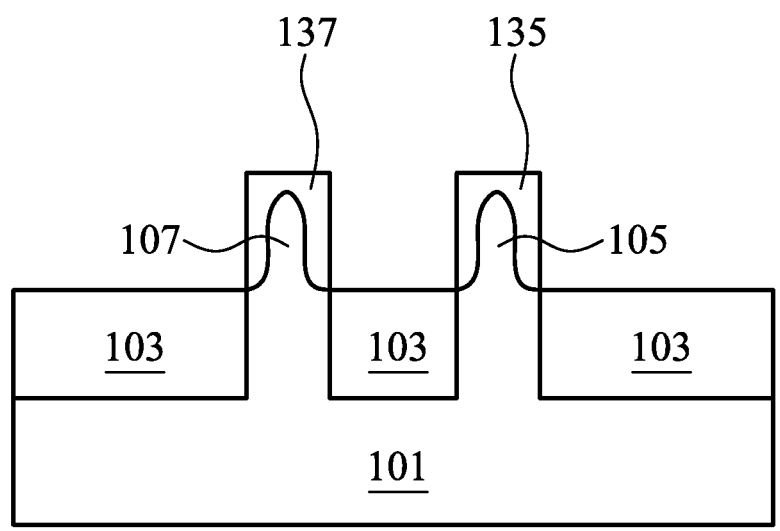

FIG. 8 shows a substrate comprising a first fin 105 and a second fin 107 have LDD region 135 and LDD region 137 respectively. The LDD region 135 may be formed in the first semiconductor fin 105 using essentially the same process as discussed, except the second semiconductor fin 107 is covered by a hard mask during the formation of LDD region 137, and the first semiconductor fin 105 may have an opposite conductivity type than the second semiconductor fin 107. The dopant concentration in LDD regions may be between about $1E20/cm^3$ and about $1E21E/cm^3$, for example.

After the formation of LDD regions 135 and 137, gate spacers (not shown) may be formed. In subsequent process steps, n-type impurities (such as phosphorous) and p-type impurities (such as boron) may be implanted into fins 105 and 107, depending on the desirable conductivity types, to form deep source and drain regions (not shown). The dopant concentration in deep source/drain regions (not shown) may be between about $1 \times 10^{20}/cm^3$ and about $1 \times 10^{21}/cm^3$, for example. FinFETs in the first device region 100 and the second device region 200 are thus formed.

FIGS. 1-11 are simplified for a better understanding of the inventive concepts of the present disclosure. For example, although the figures illustrate the FINFETs, it is understood the ICs may also include a number of various devices including resistors, capacitors, inductors, fuses, etc.

Various embodiments of the present invention may be used to moderate the shortcomings of the conventional LDD process. For example, in the various embodiments the formation of dopant-rich layer 131, the formation of cap layer 133 and the annealing process drive the impurities of the LDD region to a desirable depth without the concern of the shadowing effect and PAI induced twin boundary defects. Therefore, electrical performances of the devices can be improved.

In some embodiments, a method of doping a FinFET comprises forming a semiconductor fin on a substrate, the substrate comprising a first device region and a second device region. The semiconductor fin is formed on a surface of the substrate in the second device region and has a top surface and sidewalls. The method further comprises covering the first device region with a hard mask, exposing the semiconductor fin and the hard mask to a deposition process to form a dopant-rich layer comprising an n-type or p-type dopant on the top surface and the sidewalls of the semiconductor fin, and diffusing the dopant from the dopant-rich layer into the semiconductor fin by performing an annealing process. The first device region is free of diffusion of the diffused dopant or another dopant from the hard mask.

In some embodiments, a method of doping a FinFET comprises forming a hard mask that covers a first semiconductor fin of a substrate and leaves a second semiconductor fin of the substrate exposed, and applying a deposition process to the hard mask and the exposed second semiconductor fin to form a dopant-rich layer comprising an n-type or p-type dopant on a top surface and sidewalls of the second semiconductor fin. The method further comprises performing an annealing process to diffuse the dopant from the dopant-rich layer into the second semiconductor fin, wherein the first semiconductor fin is free of diffusion of the diffused dopant or another dopant from the hard mask.

In some embodiments, a method of doping a FinFET comprises, for each semiconductor fin of a first semiconductor fin of the FinFET and a second semiconductor fin of the FinFET, forming a hard mask that covers a portion of the FinFET and leaves the semiconductor fin exposed, depositing a dopant-rich layer comprising an n-type or p-type dopant directly on a top surface and sidewalls of the semiconductor fin, and performing an annealing process to drive the dopant from the dopant-rich layer into the semiconductor fin. The annealing is performed with the semiconductor fin uncovered by the hard mask and with the portion of the FinFET covered by the hard mask free of the dopant-rich layer, wherein the dopant from the dopant-rich layer is the only dopant diffused into the FinFET in the annealing process.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method of doping a fin field-effect transistor (FinFET), the method comprising:
   forming a semiconductor fin on a substrate, the substrate comprising a first device region and a second device region, the semiconductor fin being formed on a surface of the substrate in the second device region, wherein the semiconductor fin has a top surface and sidewalls;
   covering the first device region with a hard mask;
   exposing the semiconductor fin and the hard mask to a deposition process to form a dopant-rich layer comprising an n-type or a p-type dopant on the top surface and the sidewalls of the semiconductor fin;
   diffusing the dopant from the dopant-rich layer into the semiconductor fin by performing an annealing process, wherein the first device region of the substrate is free of diffusion of the diffused dopant or another dopant from the hard mask; and forming a gate stack over a portion of the top surface and the sidewalls.

2. The method of claim 1, wherein the deposition process forms the dopant-rich layer having atomic percentage of the dopant greater than 90 percent.

3. The method of claim 1, wherein the deposition process comprises a plasma-assisted process.

4. The method of claim 3, wherein the plasma-assisted process comprises biasing the substrate with a DC bias voltage less than 2 kV.

5. The method of claim 1, wherein the deposition process forms the dopant-rich layer comprising the dopant including boron, indium, phosphorous or arsenic.

6. The method of claim 1, further comprising removing a native oxide before exposing the semiconductor fin and the hard mask to the deposition process.

7. The method of claim 1, wherein diffusing the dopant from the dopant-rich layer into the semiconductor fin forms a lightly-doped source/drain (LDD) region in the semiconductor fin.

8. The method of claim 7, further comprising implanting impurity atoms in the semiconductor fin to form a deep source or drain region.

9. The method of claim 1, further comprising using a cap layer over the dopant-rich layer to prevent outward diffusion of the dopant during the annealing process.

10. The method of claim 1, further comprising removing the dopant-rich layer after diffusing the dopant from the dopant-rich layer into the semiconductor fin.

11. A method of doping a fin field-effect transistor (FinFET), the method comprising:
    forming a hard mask that covers a first semiconductor fin of a substrate and leaves a second semiconductor fin of the substrate exposed;
    applying a deposition process to the hard mask and the exposed second semiconductor fin to form a dopant-rich layer comprising an n-type or a p-type dopant on a top surface and sidewalls of the second semiconductor fin;
    performing an annealing process to diffuse the dopant from the dopant-rich layer into the second semiconductor fin, wherein the first semiconductor fin is free of diffusion of the diffused dopant or another dopant from the hard mask; and
    forming a gate stack over a portion of the top surface and the sidewalls.

12. The method of claim 11, wherein the deposition process forms the dopant-rich layer having atomic percentage of the dopant greater than 90 percent.

13. The method of claim 11, wherein the deposition process comprises a plasma-assisted process.

14. The method of claim 13, wherein the plasma-assisted process comprises biasing the substrate with a DC bias voltage less than 2 kV.

15. The method of claim 11, wherein the deposition process forms the dopant-rich layer comprising the dopant including boron, indium, phosphorous or arsenic.

16. The method of claim 11, further comprising removing a native oxide before applying the deposition process to the hard mask and the exposed second semiconductor fin.

17. The method of claim 11, wherein diffusing the dopant from the dopant-rich layer into the second semiconductor fin forms a lightly-doped source/drain (LDD) region in the second semiconductor fin.

18. The method of claim 11, further comprising using a cap layer over the dopant-rich layer to prevent outward diffusion of the dopant during the annealing process.

19. A method of doping a fin field-effect transistor (FinFET), the method comprising, for each semiconductor fin of a first semiconductor fin of the FinFET and a second semiconductor fin of the FinFET:
    forming a hard mask that covers a portion of the FinFET and leaves the semiconductor fin exposed;
    depositing a dopant-rich layer comprising an n-type or a p-type dopant directly on a top surface and sidewalls of the semiconductor fin;
    performing an annealing process to drive the dopant from the dopant-rich layer into the semiconductor fin, the annealing being performed with the semiconductor fin uncovered by the hard mask and with the portion of the FinFET covered by the hard mask free of the dopant-rich layer, wherein the dopant from the dopant-rich layer is the only dopant diffused into the FinFET in the annealing process; and
    forming a gate stack over a portion of the top surface and the sidewalls.

20. The method of claim 19, wherein depositing the dopant-rich layer comprises performing a plasma assisted deposition process.

* * * * *